United States Patent [19]
Haushalter

[11] Patent Number: 4,926,935
[45] Date of Patent: May 22, 1990

[54] COMPRESSED FIN HEAT SINK

[75] Inventor: Frederick W. Haushalter, Kenton, Ohio

[73] Assignee: Robinson Fin Machines, Inc., Kenton, Ohio

[21] Appl. No.: 319,348

[22] Filed: Mar. 6, 1989

[51] Int. Cl.$^5$ .......................... F28F 7/00; H01L 23/36
[52] U.S. Cl. .................................. 165/185; 165/80.2; 165/168; 165/171; 29/890.03
[58] Field of Search ............... 165/168, 185, 166, 171, 165/80.2; 29/157.3 R

[56] References Cited

U.S. PATENT DOCUMENTS 1,527,689  2/1925  Lewis ................................. 165/168
3,160,132  12/1964  Mowatt ............................. 165/185

Primary Examiner—Albert W. Davis, Jr.

[57] ABSTRACT

A heat sink is created from a single or multiple lengths of compressed, corrugated fin, eliminating the need for a heat sink base plate. A length of corrugated fin is compressed in a fixturing operation to form a continuous top flat surface and a continuous bottom flat surface. After the fixturing operation, a bonding operation is performed to generate permanent continuous top and bottom flat surfaces on which elements requiring temperature control may be mounted directly, eliminating the cost and weight of a base plate.

2 Claims, 1 Drawing Sheet

COMPRESSED FIN HEAT SINK

BACKGROUND OF THE INVENTION

This invention relates to a method for creating a heat sink and, more particularly, to a method for creating a heat sink from 100% compressed fin material to eliminate the need for a heat sink base plate.

A heat sink is a widely used absorptive thermal protection system. Heat sinks have the advantages of simplicity, dependability, and for reusable vehicles, ease of refurbishment. However, heat sinks currently require a base plate between a length of corrugated fin and any element or component to be temperature controlled. The need for the base plate increases both the cost and the weight of the heat sink. In any manufacturing process including the manufacture of heat sinks, it is desirable to reduce manufacturing costs. This may be accomplished in a variety of ways including the elimination of a component or element of a component used in the process while retaining the function of that component or element. For example, eliminating the heat sink base plate while still providing a continuous flat surface on which to mount electrical components could greatly reduce the cost of constructing the heat sink as well as reduce the overall weight of the finished product.

SUMMARY OF THE INVENTION

This invention discloses a method for creating a heat sink from a piece of fin, eliminating the need for the base plate currently required for heat sinks.

In the subject invention, the method for creating a heat sink entails the performance of a secondary operation on a corrugated length of fin. This secondary operation involves compressing and bonding the connecting surface of the fin corrugation to generate a continuous flat surface on which electrical components may be mounted directly, eliminating the need for an intervening base plate.

The primary advantage of this invention is the reduced cost of producing a heat sink and, therefore, any article utilizing a heat sink, by eliminating the base plate while retaining its function of providing a continuous flat surface for mounting electrical components. Another advantage of this invention resulting from the elimination of the base plate is the reduction in the overall weight of the heat sink.

BRIEF DESCRIPTION OF THE DRAWING

The foregoing and other objects of this invention may be best understood by reference to the following description of a preferred embodiment and the drawing in which.

DESCRIPTION OF THE PREFERRED EMBODIMENT

Figure 1:
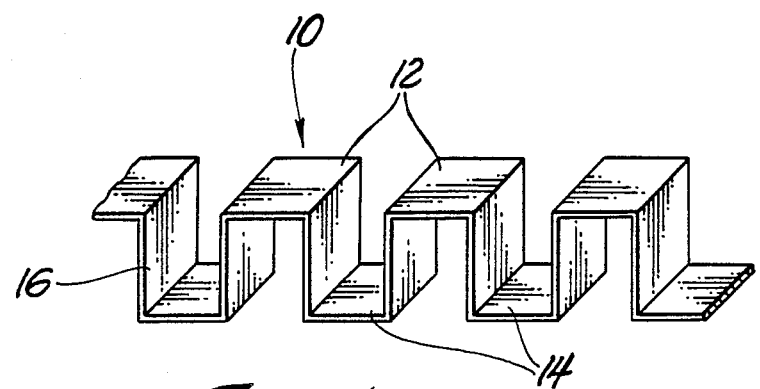
FIG. 1 is a front view of a corrugated length of fin.

Referring to the drawing, and more particularly to FIG. 1, reference numeral 10 generally designates a corrugated length of fin. The length of corrugated fin 10 may be constructed from a flat sheet of any suitable material, such as aluminum or copper, by any suitable means including use of a fin forming machine.

In the preferred embodiment of this invention, top connecting surface 12 and bottom connecting surface 14 connect the interposing lines of fin 16 to create a continuous corrugated length of fin. This length of fin may be compressed as shown in FIG. 2 by means of a fixturing operation.

Figure 2:
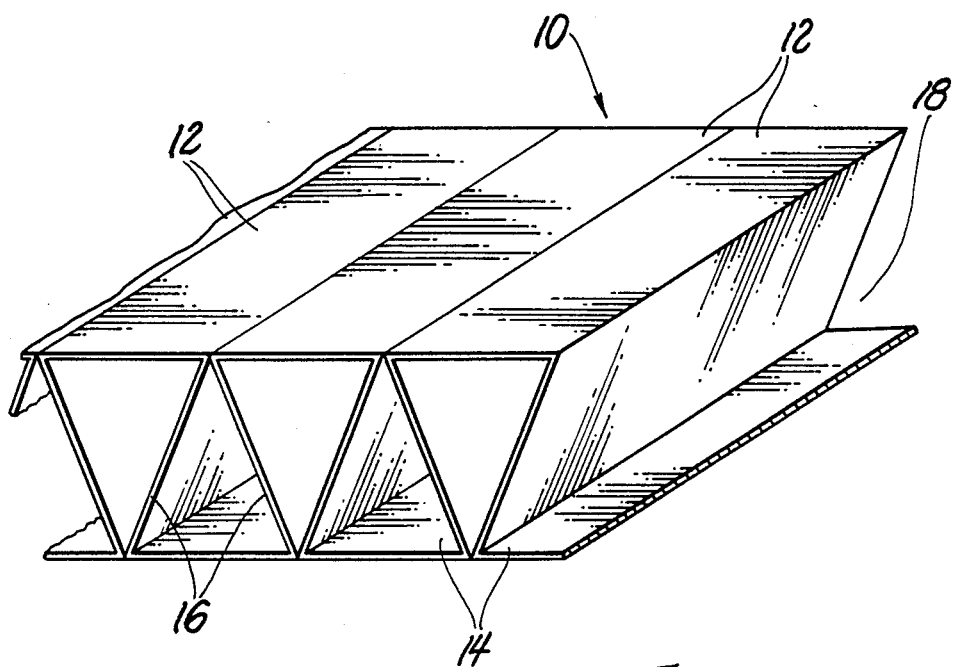
FIG. 2 is a front view of a compressed, corrugated length of fin showing the profile of the continuous flat surface on which electrical components may be mounted.

Referring now to FIG. 2, reference numeral 10 generally designates the corrugated length of fin after it has been compressed by a fixturing operation. When the fin is compressed, top connecting surface 12 and bottom connecting surface 14 form a continuous top flat surface and a continuous bottom flat surface. Although the fin 10 is compressed, it still maintains its cooling abilities since air flows easily through the spaces 18 between the interposing lines of fin 16.

In the preferred embodiment of this invention, after compressing the length of fin to form the continuous top and bottom flat surfaces, a bonding process such as brazing is performed on the compressed corrugated fin to generate permanent continuous top and bottom flat surfaces on which electrical components may be mounted. This invention results in both a cost and a weight reduction in heat sinks by eliminating the need for a heat sink base plate while still providing a continuous flat surface on which electrical components may be mounted for cooling purposes.

The embodiments of the invention in which an exclusive property or privilege is claimed are defined as follows:

1. A heat sink created from a length of fin, the heat sink being formed by method steps, said steps comprising:
   generating a continuous corrugated piece of fin from a flat sheet of a metal, the fin including top and bottom connecting surfaces for connecting interposing lines of fin;
   compressing the fin to form continuous top and bottom flat surfaces; and
   bonding the compressed corrugated top and bottom connecting surfaces of the fin to generate permanent continuous top and bottom flat surfaces, whereby components may be directly mounted on the flat surface without the need for an intervening base plate.

2. A method for creating a heat sink from a length of fin, the method comprising:
   generating a continuous corrugated piece of fin from a flat sheet of a metal, the fin including top and bottom connecting surfaces for connecting interposing lines of fin;
   compressing the fin to form continuous top and bottom flat surfaces; and
   bonding the compressed corrugated top and bottom connecting surfaces of the fin to generate permanent continuous top and bottom flat surfaces, whereby components may be directly mounted on the flat surface without the need for an intervening base plate.

* * * * *